United States Patent [19]

Sugihara

[11] Patent Number: 4,889,208

[45] Date of Patent: Dec. 26, 1989

[54] SPEAKER ENCLOSURES

[76] Inventor: Katsutoshi Sugihara, 19-21, Aoto 2-Chome Katsushika-ku, Tokyo 125, Japan

[21] Appl. No.: 156,852

[22] Filed: Feb. 17, 1988

[30] Foreign Application Priority Data

Feb. 23, 1987 [JP] Japan .................................. 62-3788

[51] Int. Cl.[4] ............................................ H05K 5/00

[52] U.S. Cl. .................................... 181/148; 181/141; 181/151; 181/152; 181/156; 181/159; 181/199; 381/153; 381/156; 381/158

[58] Field of Search ............... 181/141, 145, 148, 151, 181/199, 152, 156, 159, 160; 381/192, 153, 156, 158

[56] References Cited

U.S. PATENT DOCUMENTS

| | | | |
|---|---|---|---|
| 2,217,279 | 10/1940 | Karns | 181/145 |
| 2,458,043 | 1/1949 | Zenner | 381/192 X |
| 3,731,760 | 5/1973 | Hammes | 181/199 |
| 4,004,094 | 1/1977 | Ott | 181/151 X |
| 4,101,736 | 7/1978 | Czerwinski | 181/151 X |
| 4,161,995 | 7/1979 | Pohlmann et al. | 181/141 X |
| 4,164,988 | 8/1979 | Virva | 181/158 X |
| 4,167,985 | 9/1979 | Dunlavy | 181/148 |
| 4,421,200 | 12/1983 | Ferralli et al. | 181/144 |
| 4,433,749 | 2/1984 | Watkins et al. | 181/151 |

FOREIGN PATENT DOCUMENTS

| | | | |
|---|---|---|---|
| 563658 | 1/1957 | Italy | 181/180 |

*Primary Examiner*—B. R. Fuller
*Attorney, Agent, or Firm*—Armstrong, Nikaido, Marmelstein, Kubovcik & Murray

[57] ABSTRACT

A speaker enclosure assembly is disclosed, which comprises an enclosure provided with a baffle plate, to which a speaker unit is attached, characterized in that the enclosure is provided with a bellows-like sound pressure buffer member.

13 Claims, 8 Drawing Sheets

SPEAKER ENCLOSURES

FIELD OF THE INVENTION

The present invention relates to speaker enclosures provided with sound pressure buffer means.

BACKGROUND OF THE INVENTION

Ideally, a speaker enclosure should be provide with an infinite baffle. It is therefore very important for a speaker enclosure to provide therein means for adequately treating the sound pressure directed towards the reat of the speaker enclosure.

Up to date, various attempts were made about speaker enclosures so as to properly treat the sound pressure, as disclosed, for instance, in U.S. Pat. Nos. 4,167,985, 4,421,200 and 4,433,749. Examples of such known speaker enclosures are closed baffle type enclosures (FIG. 27), bass reflex type enclosures (FIG. 28), drown cone type enclosures (FIG. 29) and back load horn type enclosures (FIG. 30).

As shown in these figures, speaker enclosures 2 of base reflex type, drown cone type and back load horn type are provided with an opening 3 or a drown cone 4 in order to adequately use the sound pressure directed towards the rear of speaker 1*a*. The opening 3 serves as an exit for the bass sound with a phase-inverted portion. Speaker enclosures of these three types can produce clear sounds with a high efficiency at lower frequency portions thereof. However, in these speaker enclosures, the air suspension which controls the speaker vibration system, is rather weak. Furthermore, there is a resonance frequency determined by the duct length and by the drown cone, so that there is such a tendency that a somewhat colored or plain sound is generated.

Closed baffle type speaker enclosures include acoustic suspension type enclosures and air suspension type enclosures. The acoustic suspension type speaker enclosures are so designed that a large amount of sound absorptive materials is placed in the enclosures so as to absorb that portion of the sounds radiated from each speaker that is directed towards the rear of the speaker enclosure systems, thereby serving in eliminating any leakage of that portion of sounds from the enclosures. In a speaker enclosure of the air suspension type, use is made of a speaker 1 with a low value of the minimum resonance frequency (fo) in such a mammer that the vibration system of the speaker 1 is supported on an air suspension kept in the closed enclosure (2). These closed baffle type speaker enclosures 2 do not generate unclear bass sounds, but the enclosures have the following shortcomings: there is a resistance to the vibration of a cone paper 1*b* so that a stuffy and unclear sound is radiated: there is a resonance causing an excessive rebound of the air suspension; and there is a standing wave so that a distorted sound is produced.

OBJECTS OF THE INVENTION

It is an object of the invention to provide a speaker enclosure, which is remarkably good in the sound reproduction, and which is so designed that any substantial amount of standing waves are not present in the enclosure, and the physical constants of the air suspension for controlling the speaker vibration system can be selected without any limitations, so that ideally clear sounds are produced while unclear or colored sounds are not generated, contrary to known speaker enclosures of bass reflex type, drown cone type and back load horn type.

It is another object of the invention to provide a speaker enclosure, wherein any stuffy and unclear sounds are not radiated, contrary to known speaker enclosures of closed baffle type, and wherein any distorted or stuffy sounds are not produced because of no occurrence of resonance of the air suspensions.

SUMMARY OF THE INVENTION

Toward the fulfillment of this and other objects, the present invention relates to a speaker enclosure, wherein there is a speaker unit affixed to a baffle plate, characterized in that bellows-like sound pressure buffer means are disposed in the enclosure.

According to the invention, a bellows-like sound pressure buffer member is made from an elastic material such as a synthetic resin, and the buffer member is affixed to a portion of a speaker enclosure, with the proviso that the bellows-like buffer member should have suitable properties such as internal loss, spring constant, responsibility, etc.

The bellows-like sound pressure buffer memter receives the sound pressure generated from the rear portion of the speaker. So, the bellows-like member should have an elastic constant sufficient to buffer the air pressure generated at an infinite place, so that the the sound pressure can be buffered to the same extent as the buffer effect of the infinite baffle.

If it is desired to radiate a somewhat bound sound as in the case of a closed beffle type speaker enclosure, then it is preferred to use a bellows-like sound pressure buffer member having a bellows portion with a somewhat higy expansion performance. It is also preferred in this case to design the enclosure so as to concentrate the sound pressure of the speaker on the bellows-like buffer member, or to cover the major portion of the enclosure with the bellows-like buffer member in order to damp the standing wave in the enclosure.

PREFERRED EMBODIMENTS OF THE INVENTION

Embodiment 1

Figure 1:
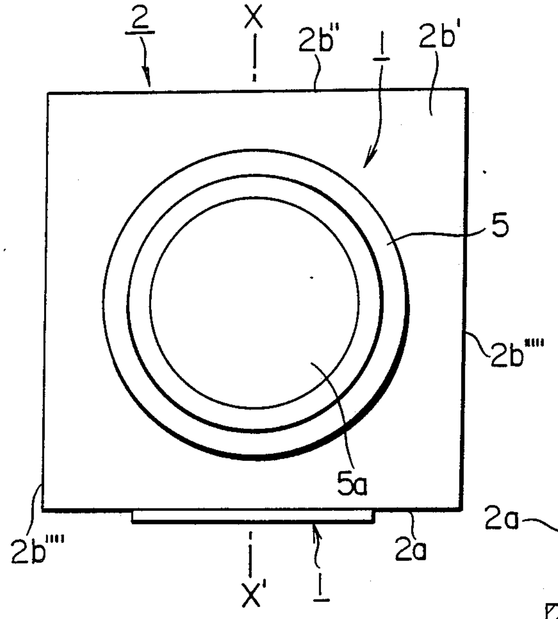
FIG. 1 shows a plan view of a speaker enclosure according to the embodiment 1 of the present invention.

Now, an explanation will be made about the embodiment 1 of the invention with reference to FIGS. 1 to 3 of the drawing attached hereto.

Figure 2:
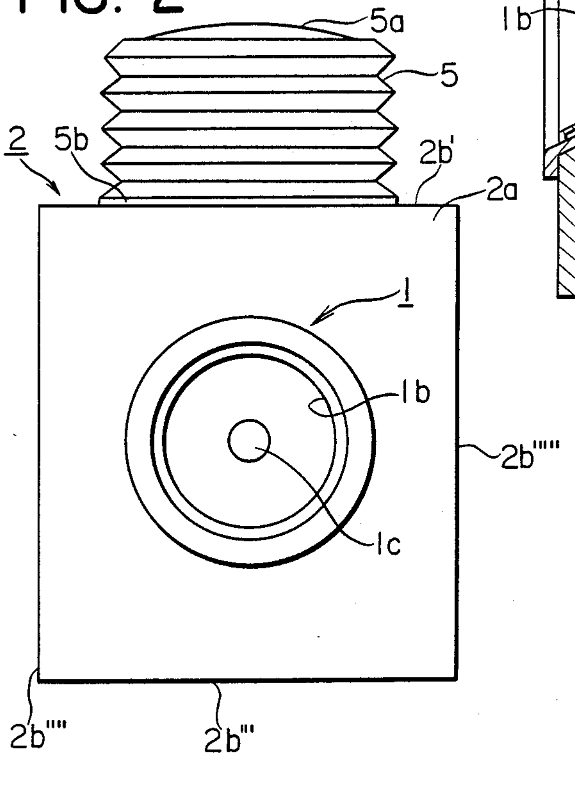
FIG. 2 shows a front view of the speaker enclosure of FIG. 1.
Figure 3:
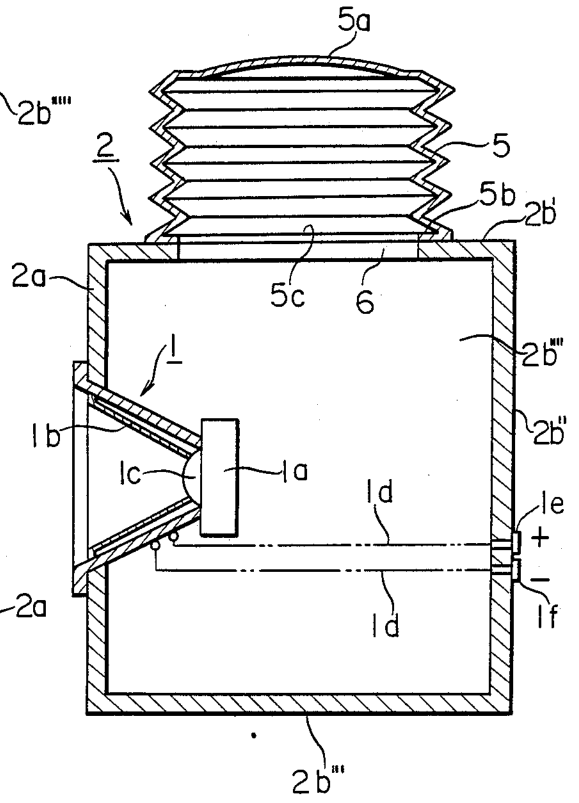
FIG. 3 shows a longitudinal sectional view of the speaker enclousr taken along the line X—X' of FIG. 1.

In FIGS. 1 to 3, the reference numeral 10 represents a speaker enclosure fromed of a hard or rigid material such as a hard synthetic resin and having a front panel i.e. baffle panel 2*a*, an upper panel 2*b*', a rear panel 2*b*'', a bottom panel 2*b*''', and two side panels 2*b*'''' and 2*b*'''''. A speaker unit 1 is fixed to the baffle panel 2*a* in such a way that the speaker unit 1 extends backwards through an opening formed in the baffle panel 2*a*. A bellows-like sound pressure buffer member 5 has an upper closed end 5*a* and a lower open end 5*b*, which is connected to the upper panel 2*b*' of the enclosure 2, in such a manner that there is an opening 6 communicating with the internal area of the bellows-like member 5. The speaker unit 1 comprises a speaker 1*a*, a paper cone 1*b*, a center cap 1*c*, lead wires 1*d*, a terminal (+) 1*e* and a terminal (−) 1*f*. The bellows member 5 is formed of an elastic material such as an elastic synthetic resin and has properties including spring constant and responsibility sufficient to damp the sound pressure generated from the speaker 1*a* and directed towards the rear of the enclosure 2.

In the case of the embodiment 1 of the invention, the bellows member 5 has an effect of damping or absorbing the sound pressure generated by the speaker 1*a* and directed towards the rear of the enclosure 2. The sound pressure, which is directed towards the rear of the enclosure 2, arrives at the bellows member 5 via the opening 6, and pushes the bellows member 5, so that the bellows member 5 vibrates reciprocally and damps and absorbs the pressure of the bass sound having frequencies between 30 and 200 Hz. The medium frequency sound of 200 Hz to 3 KHz is buffered and absorbed by the bellows member 5 in such a manner that the fold portion of the member 5 randomly reflects the sound, and so that the bellows member 5 itself vibrates to a small extent. It is possible to vary the load of the speaker in a wide range between the infinite baffle characteristics and the closed baffle characteristics, by varying the length of the bellows-like member 5, the elastic strength of the spring portion of the member 5, and the degree of the sound pressure loss.

To keep a desired degree of the sound pressure loss, it is possible to make a small hole (not shown) in the closed upper end portion 5*a* of the bellows member 5, or to make the bellows member 5 from a slightly permeable material.

The bellows member 5 can be formed, for instance, from paper, a soft synthetic resin sheet, a hard synthetic resin sheet, a metal sheet, or another material suitable for the bellows. Such a material may be a single or composite material. As shown in FIG. 3, the bellows member 5 can be affixed to the upper panel 2*b*' of the enclosure 2 by adhering the bottom open end portion 5*b* to the peripheral portion of the opening 6 made in the upper panel 2*b*'. Alternatively, it is possible to removably engage the enclosure 2 with the bellows member 5 as shown in FIGS. 4 to 7. The reference number 5*c* in FIG. 3 represents the uncovered area of the lower end portion 5*b* of the bellows member 5.

Embodiment 2

Figure 8:
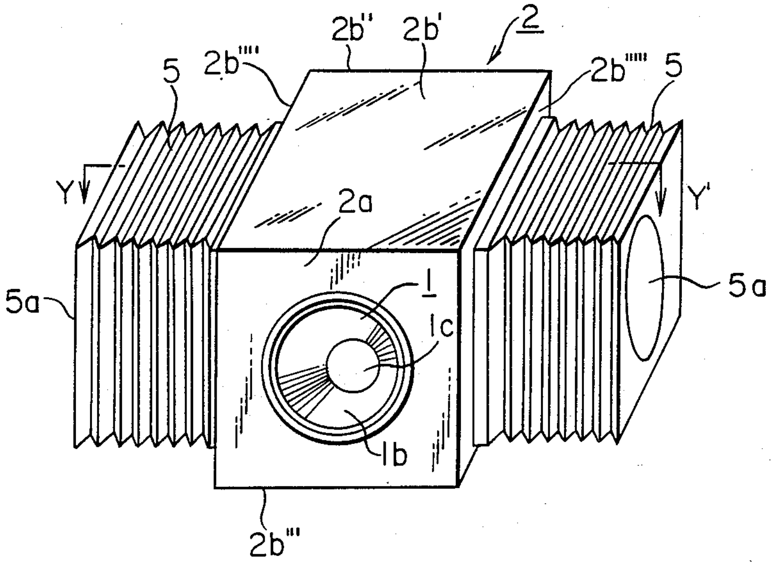
FIG. 8 shows a perspective view of a speaker enclosure according to the embodiment 2 of the invention.
Figure 9:
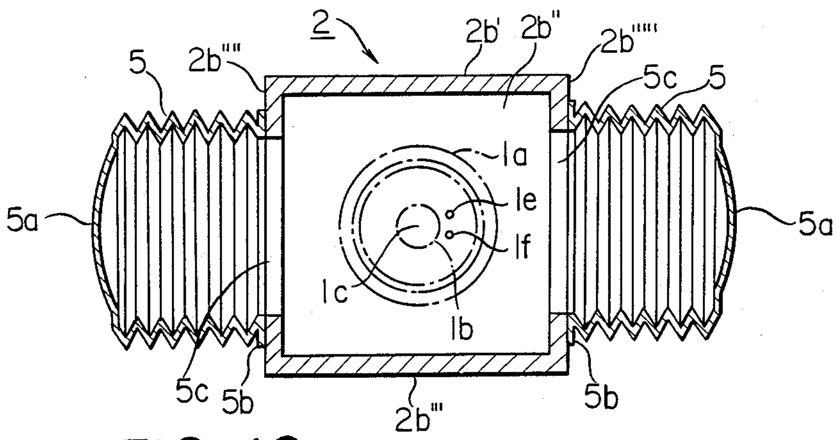
FIG. 9 shows a longitudinal sectional view taken along the line Y—Y' of FIG. 8.
Figure 10:
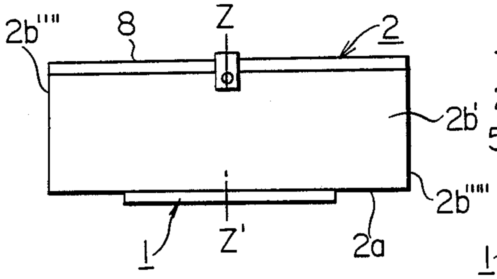
FIG. 10 shows a plan view of a speaker enclosure according to the embodiment 3 of the invention.
Figure 11:
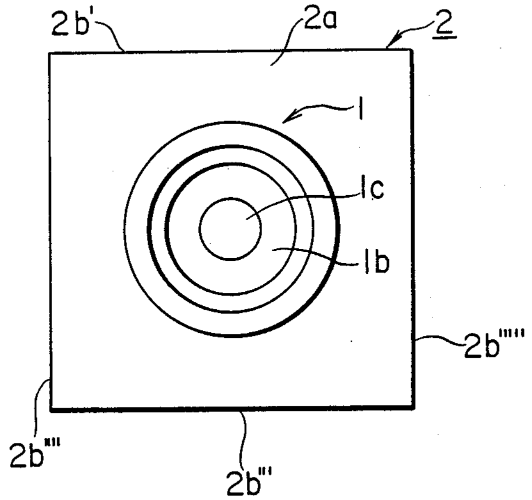
FIG. 11 shows a front view of the speaker enclosure of FIG. 10.

FIGS. 8 and 9 show a speaker enclosure according to the embodiment 2 of the invention. The speaker enclosure 2 according to this embodiment is formed of a hard material such as a hard synthetic resin material and having a baffle panel 2*a*, a upper panel 2*b*', a rear panel 2*b*'', a bottom panel 2*b*''', and two side panels 2*b*'''' and 2*b*'''''. To the two side panels 2*b*'''' and 2*b*''''' each of the enclosure 2, a belows member 5 is affixed in a similar manner to that shown in the embodiment 1. The two bellows members 5 and 5, employed in the embodiment 2, are formed from a material having properties including the spring constant and the responsibility sufficient to damp the undesired sound pressure of the speaker in the manner as in the embodiment 1.

In the embodiment 2, it is possible to employ means for keeping a desired degree of the sound pressure loss, as in the case of the case of the embodiment 1. The two bellows members 5 and 5 should be formed of a material which meets the conditions for the elastity constant and the responsibility suitable for the sound pressure of the speaker, as in the case of the embodiment 1. The sound pressure buffer and absorption effect of the speaker enclosure according to the embodiment 2 is similar to that according to the embodiment 1, as far as sounds of a low and medium frequency range are concerned. In the embodiment 2, the two bellows members 5 and 5 can be affixed to the enclosure 2 by a method similar to that illustrated either in FIG. 3 or FIGS. 4 to 7.

Embodiment 3

Figure 12:
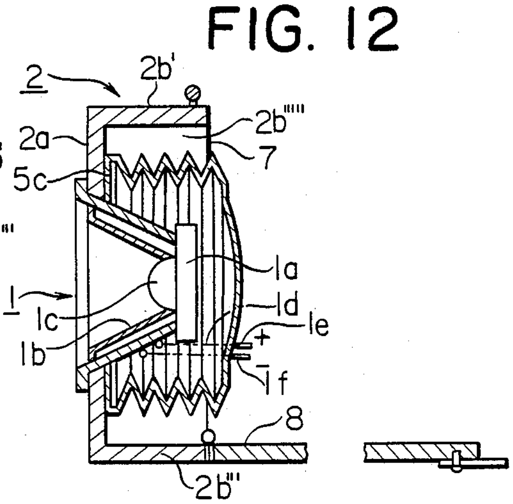
FIG. 12 shows a longitudinal sectional view taken along the line Z—Z' of FIG. 10, when the cover plate has been removed from the speaker.
Figure 13:
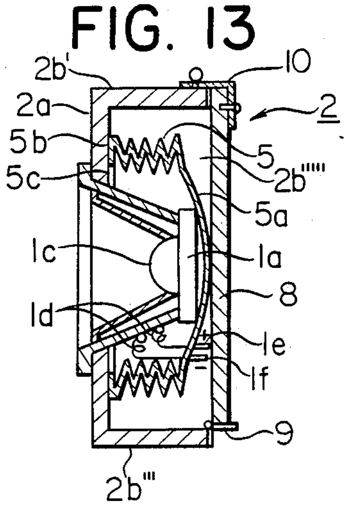
FIG. 13 shows a longitudinal sectional view taken along the line Z—Z' of FIG. 10, when the cover plate has been applied to the speaker.

FIGS. 10 to 13 show a portable speaker enclosure 2 according to the embodiment 3 of the invention. The enclosure 2 has a baffle panel 2a, an upper panel 2b', a bottom panel 2b''' and two side panels 2b'''' and 2b''''', and lacks a rear panel, so that the enclosure 2 is open at the rear portion thereof. A speaker unit 1 is mounted in the baffle panel 2a. The rear end of the enclosure 2 is removally covered with a cover panel 8 instead of a fixed rear panel. The cover panel 8 is connected at an edge thereof to the enclosure 2 by means of a hinge. As shown in FIGS. 12 and 13, the speaker unit 1 projects backwards through the rear side of the baffle panel 2a, and the bellows member 5 is disposed on the rear side of the baffle plate 2a in such a way that the baffle member 5 covers and surrounds the speaker unit 1. The open end of the bellows member 5 is adhered or removably connected to the rear side of the baffle panel 2a in a manner similar to that employed in the embodiment 1. When the speaker 1a is to be used, the cover panel 8 is opened as shown in FIG. 12. When the speaker enclosure is to be stored or transported, the rear end of the enclosure 2 is covered with the cover panel 8. The reference numerals 9 and 10, given in these figures, represent a hinge member and a fastener member, respectively. In the embodiment 3, the speaker enclosure 2 may be provided with means for keeping a desired degree of the sound pressure loss concerning the sound directed to the rear, as in the case of the embodiment 1. The bellows member 5 is formed of a material which satisfies the conditions for elasticity and the responsibility necessary for adequately damping the sound pressure of the speaker, as in the case of the embodiment 1. In addition, the sound pressure buffer and absorption effect of the speaker enclosure according to the embodiment 3 is similar to that according to the embodiment 1, as far as sounds of a low and medium frequency range are concerned. The bellows member 5 may be fixed to the enclosure 2 with the aid of an adhesive, or it is possible to removally connect the bellows member 5 to the enclosure 2 by means of a screw or the like.

Embodiment 4

Figure 14:
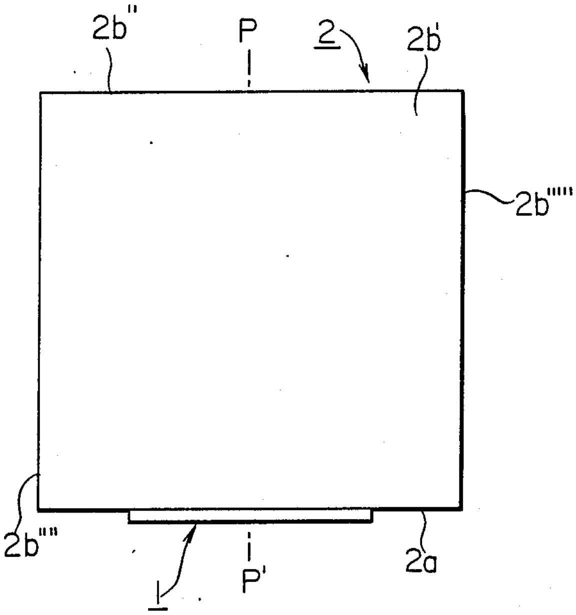
FIG. 14 shows a plan view of a speaker enclosure according to the embodiment 4 of the invention.
Figure 15:
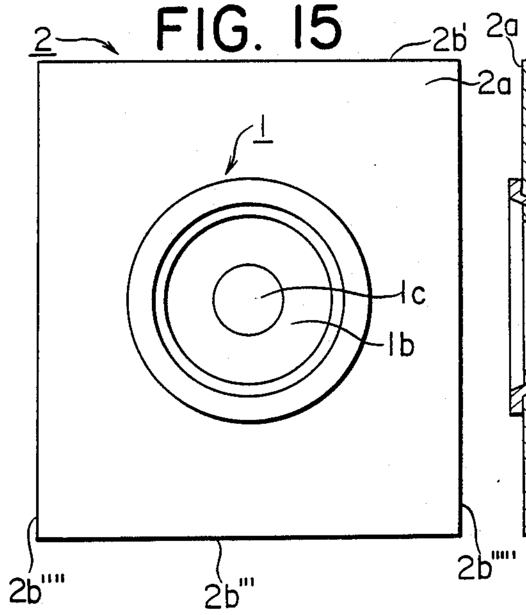
FIG. 15 shows a front view of the enclosure of FIG. 14.
Figure 16:
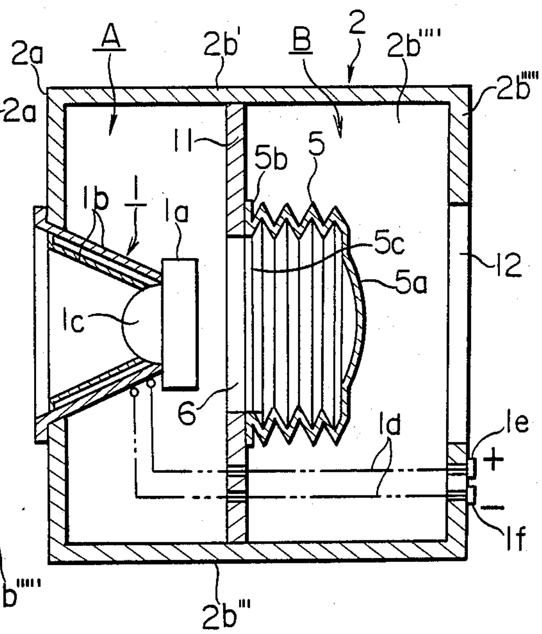
FIG. 16 shows a longitudinal sectional view taken along the line P—P' of FIG. 14.

FIGS. 14 to 16 shows a speaker enclosure according to the embodiment 4 of the invention. A characteristic feature of the embodiment 4 is that the speaker enclosure 2 has a vertical partition panel 11 in a position rear the speaker unit 1 in the direction paralle to the baffle panel 2a, so as to divide the internal space of the enclosure 2 into a front room A and a rear room B. The partition panel 11 has a hole 6, and the open end 5c of a bellows member 5 is fixed to the rear side of the partition panel 11 so as to keep a communication between the hole 6 and the open end of the bellows member 5. The rear panel 2b'' of the enclosure 2 is has an opening 12, which communicates with the rear room B. The open end 5b of the bellows member 5 has a peripheral area 5c, which is fixed to the peripheral portion of the hole 6 in the rear room B.

The bellows member 5, employed in the embodiment 4, is formed from a material having properties including the elasticity constant and the responsibility adapted to the sound pressure of the speaker, as in the case of the embodiment 1. Furthermore, the effect of the speaker enclosure 2 according to the embodiment 4, in buffering and absorbing the pressure of sounds having a low and medium frequency range, is virtually identical with that of the enclosure according to the embodiment 1.

In the embodiment 4, the bellows member 5 may be fixed to the enclosure 2 with the aid of an adhesive. It is also possible to removably connect to the bellows member 5 to the enclosure 2 as illustrated in FIGS. 4 to 7. Referring to the enclosure 2 according to the embodiment 4, wherein the bellows member 5 is present in the rear room B, it should be noted that the rear panel 2b'' of the rear room B in the enclosure 2 has an opening 12, so that the bellows member 5 can be elastically moved in response to the sound pressure with a sharper sensitivity.

Embodiment 5

Figure 17:
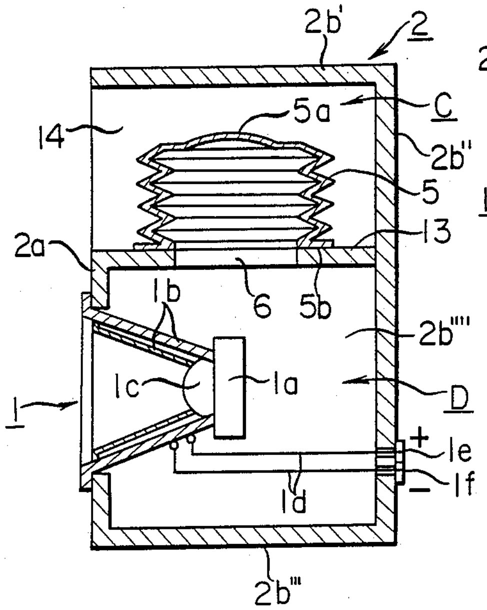
FIG. 17 shows a longitudinal sectional view of a speaker enclosure according to the embodiment 5 of the invention.

FIG. 17 shows a speaker enclosure 2 according to the embodiment 5 of the invention. The speaker enclosure 2 has a baffle panel 2a, an upper panel 2b'', a rear panel 2b'', a bottom panel 2b''' and two side panels 2b'''' and 2b'''''. A speaker unit 1 is mounted on the baffle panel 2a. The enclosure 2 has a horizontal or lateral partition panel 13 so as to divide the internal area of the enclosure 2 into two rooms i.e. a upper room C and a lower room D. The speaker unit 1 is disposed in the lower room D. The partition pamel 13 has an opening 6, and the open end of the bellows member 5 is affixed to the upper side of the partition panel 13 at the peripheral area of the opening 13, so as to keep a communication between the opening 6 and the open end of the bellws member 5. In the embodiment 5, it is possible to provide means for keeping a desired internal loss of the sound pressure, as in the case of the embodiment 1. The bellows member 5 is formed from a material having a elasticity constant and a responsibility adapted to the sound pressure of the speaker, as in the case of the embodiment 1.

In addition, the sound pressure buffer and absorption effect of the speaker enclosure according to the embodiment 4 is virtually the same as that according to the embodiment 1, as far as the sound has a low and medium frequency range. The bellows member 5 can be affixed to the enclosure 2 by adhering the open end of the bellows member 5 to the peripheral area of the opening 6 of the partition panel 13 in the enclosure 2, as shown in FIG. 17. It is also possible to removably attach the bellows member 5 to the enclosure 2.

In the embodiment 5, an opening 14 is present in a panel surrounding the upper room A, so that the elastic motion of the bellows member 5, due to the sound pressure, is made with a sharp sensitivity.

Embodiment 6

Figure 18:
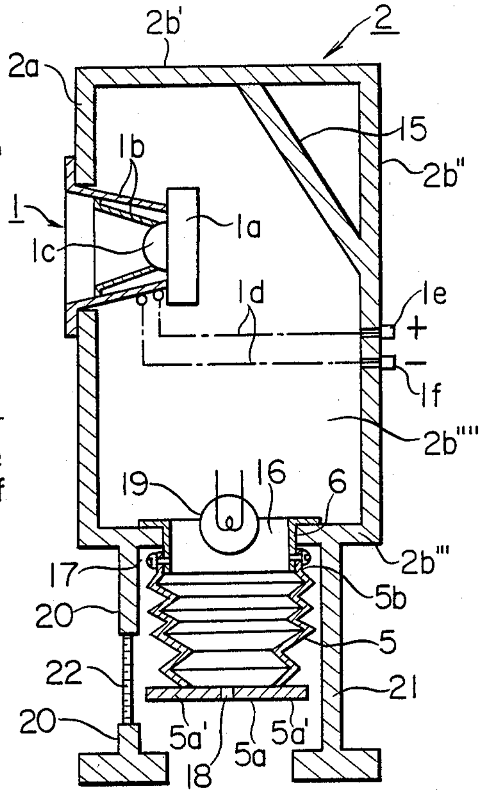
FIG. 18 shows a longitudinal sectional view of a speaker enclosure according to the embodiment 6 of the invention.

FIG. 18 shows a speaker enclosure 2 according to the embodiment 6 of the invention. The enclosure 2 has a baffle panel 2a, an upper panel 2b', a rear panel 2b'', a bottom panel 2b''' and two side panels 2b'''' and 2b'''''. A speaker unit 1 is affixed to the baffle panel 2a. The panels 2b' to 2b''''' are formed from a hard material such as a hard synthetic resin material. In the internal area of the enclosure 2, a reflecting panel 15 is disposed in an oblique direction in a position rear the speaker unit 1 with the proviso that the upper edge of the reflecting panel 15 is affixed to the upper panel 2b', and the bottom edge of the reflecting panel 15 is affixed to the rear panel 2b" of the enclosure 2. An opening with a relatively large diameter is formed in the bottom panel 2b"', and a ring for connecting a bellows member 5 is mounted in the opening 6. The open end 5b of the bellows member 5 is removally connected to the internal or external side of the ring by means of screws 17. In order to adequately reduce the influence of sound pressure on the closed end 5a of the bellows member 5, it is possible to provide a hole 18 in the closed end 5a, or to from the hollows member 5 from an air-permeable material. The closed end 5a of the bellows member 5 projects over the enclosure 2. The bellows member 5 has a cross section of a trapezoidal or taper shape. The reference numeral 19 represents a light source which may be an electric lamp or a layer coated with a fluorescent paint. The enclosure 2 has legs 20 and 21. At least one of these legs is provided with a window 22 having a scale for the output level. Therefore, it is possible to directly determine the sound pressure by visually observing, through the window 22, the edge 5a' of the closed end 5a of the bellows member 5.

Embodiment 7

Figure 19:
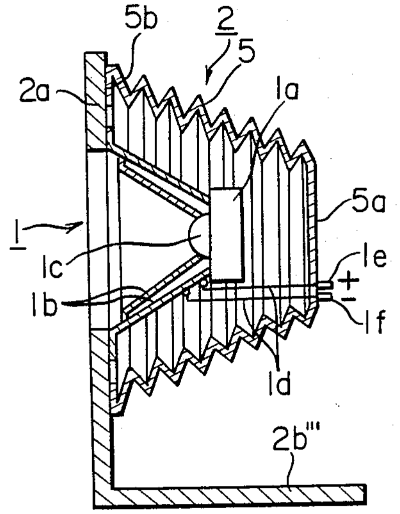
FIG. 19 shows a longitudinal sectional view of a speaker enclosure according to the embodiment 7 of the invention.

FIG. 19 shows a speaker enclosure 2 according to the embodiment 7 of the invention. The enclosure 2 has a baffle panel 2a, and an extended portion there of is bent to from a bottom panel 2b"'. A speaker unit 1 is affixed to the baffle panel 2a. A bellows member 5 is also affixed to the baffle panel 2a. The bellows member 5 has a frusto-conical shape, and is connected to the baffle panel 2a so as to cover and surround the speaker unit 1, by fixing the open end 5b of the bellows member 5 to the baffle panel 2a with the aid of an adhesive or a screw. Thus, in this embodiment, the enclosure 2 is formed by the baffle panel 2a and the bellows member 5.

Embodiment 8

Figure 20:
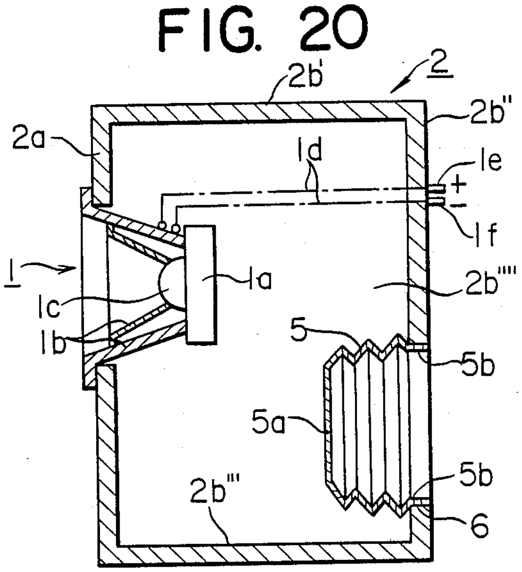
FIG. 20 shows a longitudinal sectional view of a speaker enclosure according to the embodiment 8 of the invention.

FIG. 20 shows a speaker enclosore 2 according to the embodiment 8 of the invention. The enclosure 2 is formed from a hard material such as a hard synthetic resin material, and has a baffle panel 2a, an upper panel 2b', a rear panel 2b", a bottom panel 2b"' and two side panels 2b"" and 2b""'. The baffle panel 2a is provided with a speaker unit 1. A bellows member 5, having a taper or frusto-conical shape, is disposed in a rear position of the internal area of the enclosure 2, by affixing the open end of the bellows member 5 to the rear panel 2b" of the enclosure 2.

Embodiment 9

Figure 21:
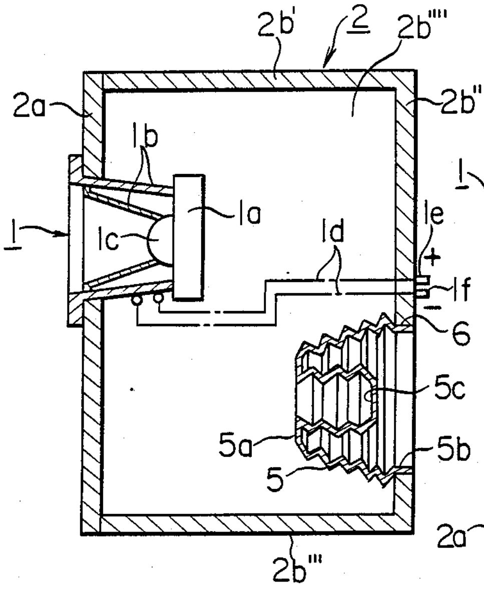
FIG. 21 shows a longitudinal sectional view of a speaker enclosure according to the embodiment 9 of the invention.

FIG. 21 shows a speaker enclosure 2 according to the embodiment 9 of the invention. The enclosure 2 has a bellows member 5 as in the case of the embodiment 8, and furthermore has a small bellows member 5c. The small bellows member 5c is present in the internal area of the bellows member 5 in such a menner that the small bellows member 5c is attached to the closed end 5a of the bellows member 5.

Embodiment 10

Figure 22:
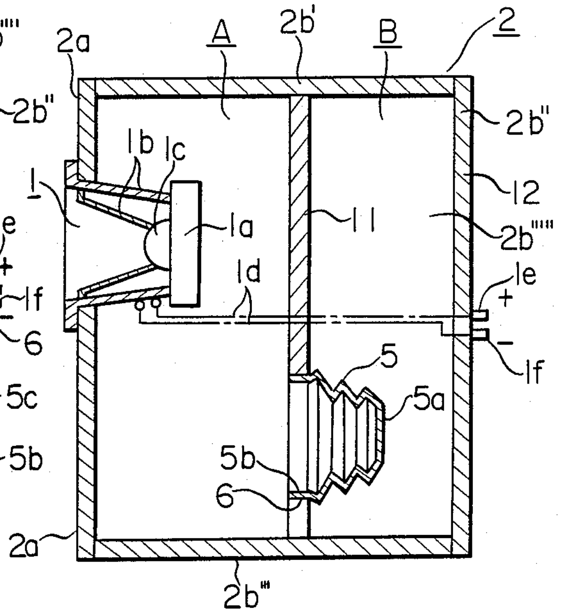
FIG. 22 shows a longitudinal sectional view of a speaker enclosure according to the embodiment 10 of the invention.

FIG. 22 shows a speaker enclosure 2 according to the embodiment 10 of the invention. The enclosure 2 has a partition panel 11 so as to divide the internal area of the enclosure 2 into two rooms A and B, as in the case of the embodiment 4 which is illustrated in FIG. 16. However, in the embodiment 10, the bellows member 5 has a frusto-conical shape, so that the cross section of the closed end 5a has a smaller size, as compared with the cross sectional size of other portios of the bellows member 5. The rear panel 2b" of the enclosure 2 has a small hole 12 which communicates with the rear room B.

Embodiment 11

Figure 23:
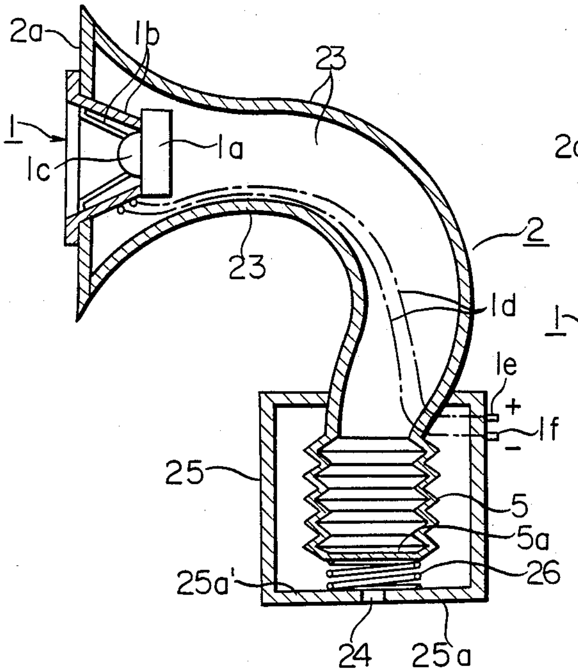
FIG. 23 shows a longitudinal sectional view of a speaker enclosure according to the embodiment 11 of the invention.

FIG. 23 shows a speaker enclosure 2 according to the embodiment 11 of the invention. The enclosure 2 has a baffle panel 2a and a horn like member 23 attached to the rear side of the baffle panel 2a. A speaker unit 1 is affixed to the baffle panel 2a. The lower end of the horn like member 23 is provided with a bellows member 5. The lower end of the horn like member·23 and the bellows member 5 are accommodated in a box member 25. The bottom panel 25a of the box member 25 has a small hole 24. The closed end 5a of the bellows member 5 is connected via a spring member 26 to the internal side of the bottom panel 25a of the box member 25, so that the closed end 5a of the bellows member 5 encompasses the hole 24 of the bottom panel 25a.

Embodiment 12

Figure 24:
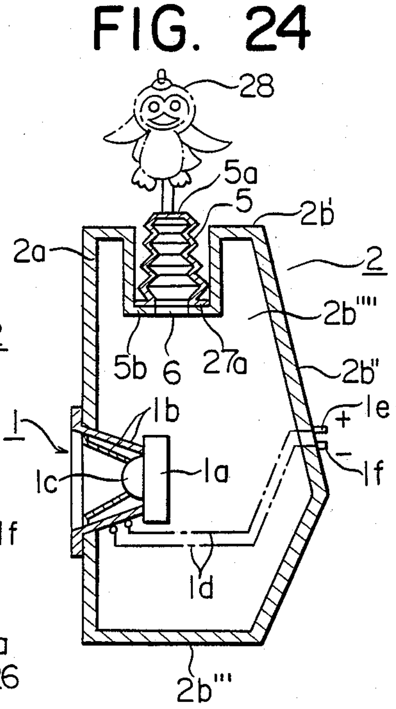
FIG. 24 shows a longitudinal sectional view of a speaker enclosure according to the embodiment 12 of the invention.
Figure 26:
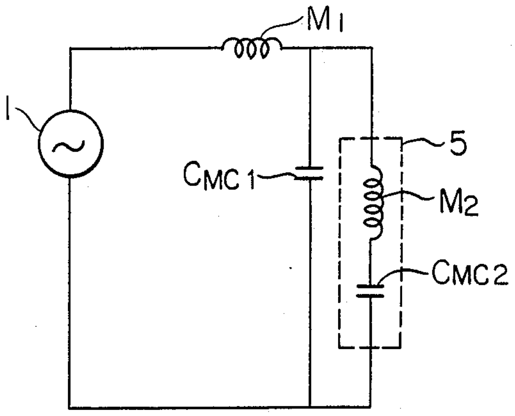
FIG. 26 shows a wiring diagram of an electric equivalent circuit employed in a speaker enclosure according to the invention.

FIG. 24 shows a speaker enclosure 2 according the embodiment 12 of the invention. The enclosure 2 has a baffle panel 2a, an upper panel 2b', a rear panel 2b", a bottom panel 2b"' and two side panels 2b"" and 2b""'. A speaker unit is affixed to the baffle panel 2a. The upper panel 2b' is provided with a recess area 27, and a hole 6 is formed in a panel 27a which surrounds the bottom of the recess area 27. A bellows member 5 is disposed in the recess area 27 around the hole 6. The bellows member 5 has a frusto-conical shape tapered upwards. A mobile or doll 28 is fixed to the closed upper end 5a of the bellows member 5, so that the mobile or doll 28 will move in an attractive manner, as the bellows member 5 vibrates.

Embodiment 13

Figure 25:
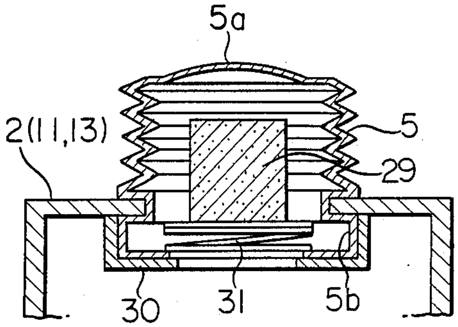
FIG. 25 shows a longitudinal sectional view of a speaker enclosure according to the embodiment 13 of the invention.
Figure 27:
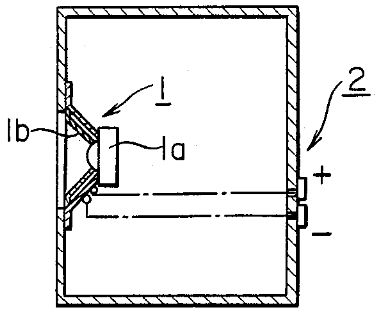
FIG. 27 PRIOR ART
FIG. 27 shows a longitudinal sectional view of a known speaker enclosure of closed baffle type.
Figure 28:
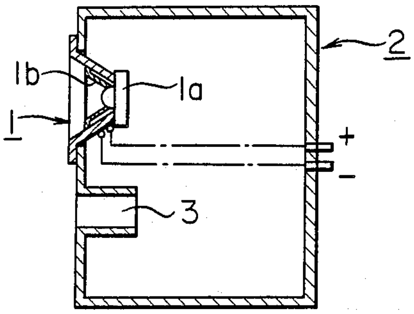
FIG. 28 PRIOR ART
FIG. 28 shows a longitudinal sectional view of a known speaker enclosure of bass reflex type.
Figure 29:
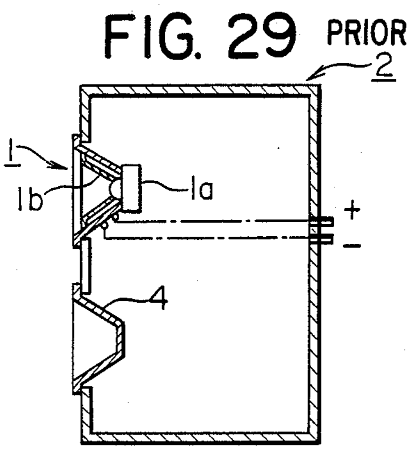
FIG. 29 PRIOR ART
FIG. 29 shows a longitudinal sectional view of a known speaker enclosure of drown cone type.
Figure 30:
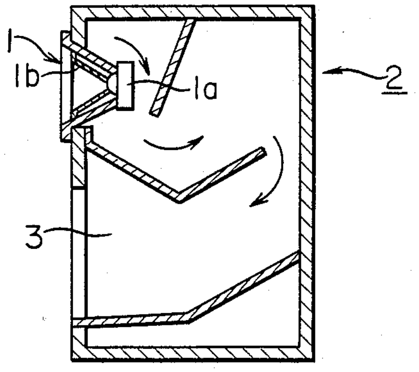
FIG. 30 PRIOR ART
FIG. 30 shows a longitudinal sectional view of a known speaker enclosure of back load horn type.

FIG. 25 shows a speaker enclosure 2 according to the embodiment 13 of the invention. A bellows member 5 is affixed to a baffle panel 2a or a partition panel 11 or 13 of the enclosure 2. A sound-absorptive member 29 is place in the internal area of the bellows member 5. The sound-absorptive member 29 is supported on a spring 31 which is, in turn, received in a spring shoe member 30. In the embodiments 6 to 12 illustrated in FIGS. 18 to 25, respectively, it is possible to employ means for keeping an adequate internal loss of the sound pressure generated by the speaker 1a and directed towards the rear, as in the case of the embodiment 1. Furthermore, in the embodiments 6 to 13, the bellows member 5 may be formed from a material having properties including a spring constant and a responsibility adapted to the sound pressure of the speaker, as in the case of the embodiment 1. In addition, the speaker enclosure 2 according to any of the embodiments 6 to 13 has virtually the same buffer performance for sounds of low and medium frequencies, as in the case of embodiment 1.

Figure 4:
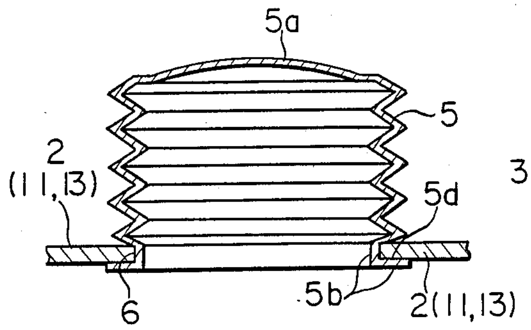
FIGS. 4 to 7 each show a sectional view illustrating the bellows portion affixed to the wall of the enclosure.
Figure 6:
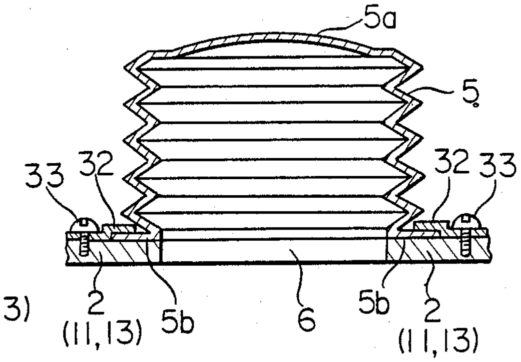
Figure 5:
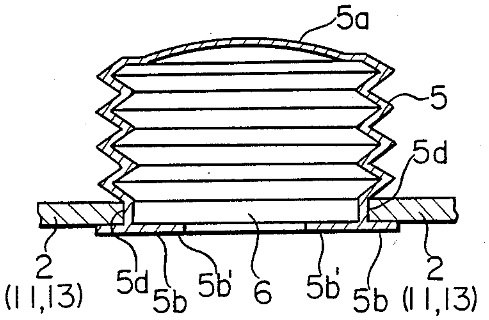
Figure 7:
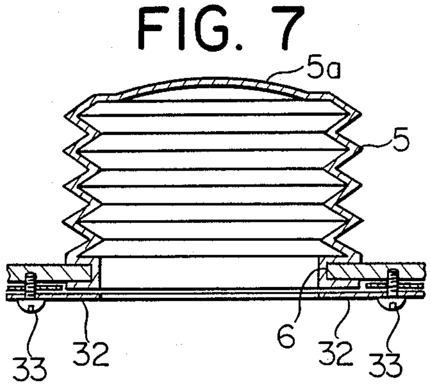

In the case of the preceding embodiments other than embodiment 11 (FIG. 23), the open portion 5c of the bellows member 5 can be connected to the enclosure 2 or to the partition panel 11 by means of an adhesive or of a releasable engagement member as shown in FIGS. 4 to 7. More specifically, FIG. 4 shows a speaker enclosure, wherein the open edge 5b of the bellows member 5 is bent outwards so as to from an L-shape, so that the end portion 5d can be removably engaged with the edge of hole 6 formed in the enclosure 2 or the partition plate 11 or 13. FIG. 5 shows a speaker enclosure, wherein the open edge *5b* is provided with an inwardly extended portion *5b'*. FIG. 6 illustrates a speaker enclosure, wherein the open edge *5b* of the bellows member 5 is contacted with the edge of the hole 6 formed in the enclosure 2 or the partition plate 11 or 13, so that the open edge *5b* is fixed to the enclosure 2 or partition plate 11 or 13 by means of a bolt 33 passing through a washer 32 and hole 6. FIG. 7 ahows a modification of the embodiment of FIG. 4. In FIG. 7, the enclosure 2 or partition plate 11 or 13 is fixed to the edge of the hole 6 by means of a bolt 33 passing through an annular washer 33 into the edge of the hole 6.

EFFECTS OF THE INVENTION

Now, an explanation is made about the effects of the invention with reference to an equivalent circuit as shows in FIG. 20. The sound pressure produced by the speaker unit 1 and radiated backwards is bufferd by the air spring $M_1$ in the internal area of the enclosure 2 having an internal volume of $C_{MC1}$.

However, if the sound pressure is added with the air spring in series, then the value of the minimum resonance frequency (fo) will increase. The increased minimum resonance frequency (fo) is buffered by an air spring $M_2$in the internal area $C_{MC2}$ of the bellows member 5. The sound pressure of the bass sound is buffered or absorbed by an expansion-contraction motion of the bewllows member 5. The sound pressure of the medium sound frequency is beffered or absorbed by the diffused reflections and the minor motions of plaits of the bellows member 5. As explained above, the bellows member, employed in the invention, has a spring constant corresponding to that of an air spring extended from an infinite distance, so that the sound pressure buffer effect of the present speaker enclosure is virtually the same as that of an infinite baffle. If it is required to radiate a somewhat bound sound as in the case of a closed baffle type speaker enclosure, then it is recommended to use a bellows-like sound pressure buffer member having a bellows portion with a somewhat high expansion performance in order to adjust the tone quality to a desired value. It is also preferred that the speaker enclosure (2) is provided with a bellows-like sound pressure buffer member which occupies only a portion of the enclosure (2) to radiate sounds having a desired tone quality. Furthermore, it is preferred in this case to design the enclosure in such a way that the sound pressure of the speaker is concentrated on the bellows-like buffer member, and to cover the mamjor portion of the enclosure with the bellows-like buffer member in order to damp the standing wave in the enclosure.

Figure 31:
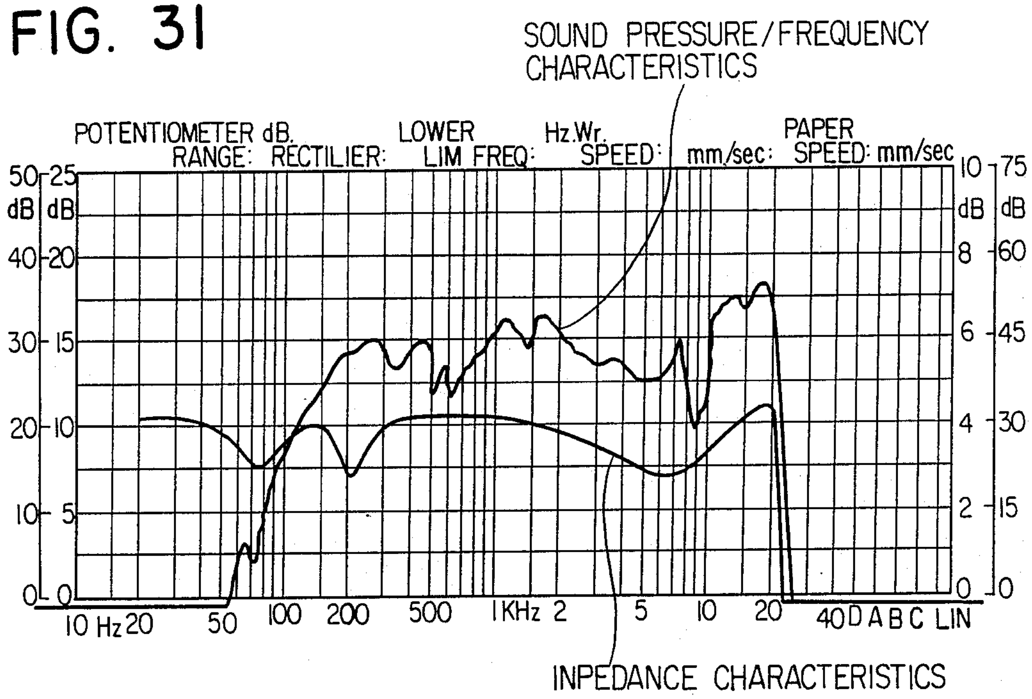
FIG. 31 shows a graph illustrating the impedance characteristic curve of a speaker enclosure according to the invention.
Figure 32:
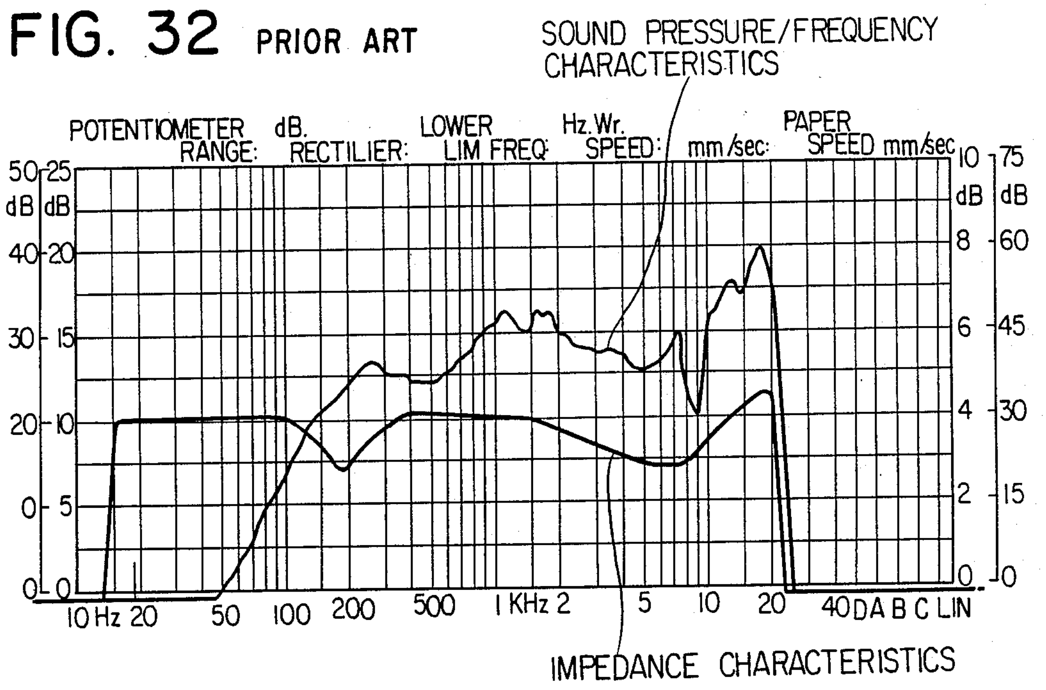
FIG. 32 PRIOR ART
FIG. 32 shows a graph illustrating the impedance characteristic curve of a known speaker enclosure of closed baffle type.

FIG. 31 shows a graph illustrating the impedance characteristics curve and the sound pressure frequency characteristics surve at a low frequency range of a speaker enclosure according to the invention operated under such a condition that the sound pressure is increased at about 2.5 db at a low frequency range not higher than 500 Hz. FIG. 32 shows a graph illustrating the acoustic characteristics of a known closed type speaker enclosure operated under such a condition that the sound pressure is not increased at a low frequency range not higher than 500 Hz.

UTILITY OF THE INVENTION

The speaker enclosures according to the invention have the following technical advantages. In the enclosures, any substantial amount of standing waves is not present. The physical constants of the air suspension for controlling the speaker vibration system can be selected without any limitations, so that ideally clear sounds are produced while unclear or colored sounds are not generated, in contrary to known speaker enclosures of bass reflex type, drown cone type and back load horn type. Any stuffy, unclear and distorted sounds are not radiated from the speaker enclosures according to the invention, in contrary to known speaker enclosures of closed baffle type, because there is no occurrence of the air suspension resonance in the present encloswres. Thus, it is believed that the invention provides novel speaker enclosures which can generate sounds in an unexpectedly good manner.

What is claimed is:

1. A sound reproduction speaker assembly comprising:

an enclosure formed by a plurality of panels joined to define a closed space, an opening through one of said panels, a speaker including a cone and an electro magnet mounted to said opening, and a sound pressure buffer member comprising a bellows having an open interior, said bellows being closed at one end and open at another end which is mounted to one of said panels with the interior of said bellows open toward said speaker to receive sound pressure generated by said speaker internally of said enclosure.

2. A sound reproduction speaker assembly as defined by claim 1, wherein said speaker is mounted with said cone projection inwardly toward an interior of said enclosure and the sound pressure buffer member is mounted to said one panel and disposed in such a way that a portion of the speaker unit, which projects inwardly is covered and surrounded with the sound pressure buffer member.

3. A sound reproduction speaker assembly as defined by claim 1, wherein a sound absorptive material is provided internally of the sound pressure buffer member.

4. A sound reproduction speaker assembly as defined by claim 1 further including an opening through a second one of said panels and said sound pressure buffer member is mounted to project outwardly of an exterior surface of said second one of said panels with said open end of said bellows surrounding said opening through said second one of said panels.

5. A sound reproduction speaker assembly as defined by claim 4, wherein said second one of said panels is an upper panel of the enclosure and the sound pressure buffer member is disposed on the exterior surface of said upper panel of the enclosure.

6. A sound reproduction speaker assembly as defined by claim 4, wherein said second one of said panels is a side panel of the enclosure and the sound pressure buffer member is disposed on the exterior surface of said side panel of the enclosure.

7. A sound reproduction speaker assembly as defined by claim 4, wherein said second one of said panels is a bottom panel of the enclosure and the sound pressure buffer member is disposed on the exterior surface of the bottom panel of the enclosure.

8. A sound reproduction speaker assembly as defined by claim 4, wherein certain of said panels forming said enclosure extend beyond said second one of said panels and with at least one additional panel enclose at least a portion of said sound pressure buffer member in a second space adjacent said closed space.

9. A sound reproduction speaker assembly as defined by claim 8, wherein said second one of said panels is a rear panel and said sound pressure buffer member and said second space are adjacent said rear panel of said speaker.

10. A sound reproduction speaker assembly as defined by claim 8, wherein said sound pressure buffer member and said second space are provided above said speaker.

11. A sound reproduction speaker assembly comprising:

a baffle panel having an opening therethrough, a speaker including a cone and an electro magnet mounted to said opening, a sound pressure buffer member comprising a bellows closed at one end and open at another end, said open end of said bellows being mounted to said baffle panel with said sound pressure buffer member surrounding and enclosing said cone and electro magnet on one side of said baffle panel, and means for supporting said baffle panel.

12. A sound reproduction speaker assembly comprising:

an enclosure formed by a plurality of panels joined to define a closed space, an opening through one of said panels, a speaker including a cone and an electro magnet mounted to said opening, and a sound pressure buffer member comprising a compound bellows having an outer first component open at one end and closed at a second end by an inner second component which is open at said second end of said first component and closed at a another end internal of said first component, an opening through a second one of said panels, and said one end of said first component of said compound bellows is mounted to said second one of said panels surrounding said opening therethrough with said open end of said second component of said compound bellows open toward said speaker to receive sound pressure generated by said speaker internally of said enclosure.

13. A sound reproduction speaker assembly comprising:

a hollow base formed by a plurality of joined panels, an opening through one of said panels, a speaker including a cone and an electro magnet, a horn shaped member mounted to said opening through said one panel with a first end of said horn shaped member external of said base and a second end of said horn shaped member internal of said base, said speaker being mounted to and closing said first end of said horn shaped member, and a sound pressure buffer member comprising a bellows closed at one end and open at another end, said open end of said sound pressure buffer member being secured to said second end of said horn shaped member internal of said base.

* * * * *